(12) United States Patent
Choi

(10) Patent No.: US 8,580,582 B2
(45) Date of Patent: Nov. 12, 2013

(54) SEMICONDUCTOR FABRICATING DEVICE AND METHOD FOR DRIVING THE SAME, AND METHOD FOR FABRICATING MAGNETIC TUNNEL JUNCTION USING THE SAME

(75) Inventor: Won Joon Choi, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/336,578

(22) Filed: Dec. 23, 2011

(65) Prior Publication Data

US 2013/0017625 A1    Jan. 17, 2013

(30) Foreign Application Priority Data

Jul. 14, 2011   (KR) .......................... 10-2011-0069697

(51) Int. Cl.
*H01L 21/00*    (2006.01)

(52) U.S. Cl.
USPC ....................................... 438/3; 257/E21.002

(58) Field of Classification Search
USPC ....................................... 257/E21.002; 438/3
See application file for complete search history.

(56) References Cited

U.S. PATENT DOCUMENTS

2010/0078309 A1*   4/2010   Ueda et al. ................. 204/192.1

* cited by examiner

*Primary Examiner* — Marvin Payen
(74) *Attorney, Agent, or Firm* — IP & T Group LLP

(57) ABSTRACT

In a method for fabricating a magnetic tunnel junction, a first magnetic layer is formed on a substrate, and a tunnel insulating layer is formed on the first magnetic layer. Subsequently, a second magnetic layer is formed on the tunnel insulating layer. In the method, the first magnetic layer is formed by periodically sputtering a magnetic target while a metal target is continuously sputtered.

10 Claims, 6 Drawing Sheets

(a)  (b)

F1

SEMICONDUCTOR FABRICATING DEVICE AND METHOD FOR DRIVING THE SAME, AND METHOD FOR FABRICATING MAGNETIC TUNNEL JUNCTION USING THE SAME

CROSS-REFERENCE TO RELATED APPLICATIONS

The present application claims priority of Korean Patent Application No. 10-2011-0069697, filed on Jul. 14, 2011, which is incorporated herein by reference in its entirety.

BACKGROUND OF THE INVENTION

Exemplary embodiments of the present invention relate to a semiconductor fabricating device and a method for driving the same, and a method for fabricating a magnetic tunnel junction using the same. More particularly, exemplary embodiments of the present invention relate to a semiconductor fabricating device and a method for driving the same, and a method for fabricating a magnetic tunnel junction using the same, which improve the integration degree of a spin transfer random access memory.

A dynamic random access memory (DRAM) and a flash memory device are representative semiconductor devices. Here, while the DRAM has a fast data processing speed because of its relatively easier data access, the DRAM are to be refreshed periodically to maintain stored data. On the other hand, while the flash memory device has non-volatile features in storing data, the flash memory device has a slow data processing speed because of its relatively difficult data access.

In producing semiconductor devices having advantages of both the DRAM and the flash memory device, a spin transfer random access memory has been developed. Here, the spin transfer random access memory is a semiconductor device using the quantum mechanical effect, i.e., magnetoresistance. The spin transfer random access memory has the easier data access of the DRAM and the non-volatile data storage features of the flash memory device.

The spin transfer random access memory includes a magnetic tunnel junction to store data. Generally, the magnetoresistance (MR) is changed depending on the magnetization direction between two ferromagnetic layers. The spin transfer random access memory senses a change in magnetoresistance and reads whether data stored in the magnetic tunnel junction is 1 or 0.

A horizontal magnetic tunnel junction using horizontal magnetic properties is generally used as the magnetic tunnel junction. When an operation for decreasing the plane area of a spin transfer random access memory is performed, the ferromagnetic property of a horizontal magnetic material in the horizontal magnetic tunnel junction changed into a paramagnetic property. Thus, it is difficult to fabricate a spin transfer random access memory having a thickness of 30 nm or thinner. Therefore, a spin transfer random access memory with an excellent integration degree using magneto resistance properties is useful.

SUMMARY

An embodiment of the present invention is directed to a semiconductor fabricating device and a method for driving the same, and a method for fabricating a magnetic tunnel junction using the same, which can fabricate a spin transfer random access memory with an excellent integration degree.

In accordance with an embodiment of the present invention, a semiconductor fabricating device includes a holding platform having a wafer mounted thereon, a first control unit configured to generate a first control signal that is constantly activated during a first period, a first sputtering unit configured to continuously sputter a metal target on the wafer in response to the first control signal, a second control unit configured to generate a second control signal that is periodically activated during the first period, and a second sputtering unit configured to periodically sputter a magnetic target on the wafer in response to the second control signal.

In accordance with another embodiment of the present invention, a method for driving a semiconductor fabricating device includes mounting a wafer on a holding platform disposed in a chamber, and applying a first control signal that is constantly activated during a first period to a first sputtering unit having a metal target attached thereto and simultaneously applying a second control signal that is periodically activated during the first period to a second sputtering unit having a magnetic target attached thereto.

In accordance with still another embodiment of the present invention, a method for fabricating a magnetic tunnel junction includes forming a first magnetic layer on a substrate, forming a tunnel insulating layer on the first magnetic layer, and forming a second magnetic layer on the tunnel insulating layer. In the method, the first magnetic layer is formed by periodically sputtering a magnetic target on the substrate during a period while continuously sputtering a metal target on the substrate during the period.

DETAILED DESCRIPTION

Figure 1:
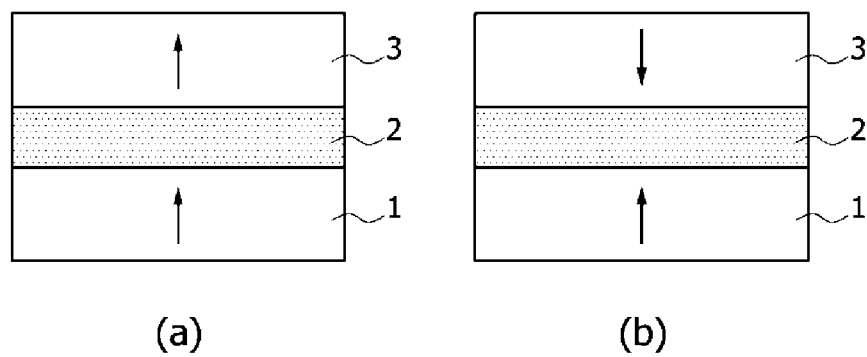
FIG. 1 is a configuration view illustrating a magnetic tunnel junction in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a configuration view illustrating a magnetic tunnel junction in accordance with an embodiment of the present invention.

As illustrated in FIG. 1, the magnetic tunnel junction includes a first magnetic layer 1, a tunnel insulating layer 2, and a second magnetic layer 3.

The first magnetic layer 1 is a thin film of which magnetization direction is fixed to be upward in a vertical direction. Here, the magnetization direction of the first magnetic layer 1, which is fixed to be upward, may have some offset from the vertical direction. The first magnetic layer 1 is formed of an alloy in which a magnetic material and a metal material are mixed together. The magnetic material is at least one selected from the group consisting of Co-, Fe- and Ni-based materials. More specifically, the magnetic material may be at least one material selected from the group consisting of Co, CoB, TaCo, CoFe, CoFeB, TaCoFe, TaCoFeB, Fe, FeB, TaFe, NiFe, NiFeB, TaNiFe and TaNiFeB. Alternatively, the magnetic material may be a material obtained by adding nitrogen to the at least one material selected from the group consisting of Co, CoB, TaCo, CoFe, CoFeB, TaCoFe, TaCoFeB, Fe, FeB, TaFe, NiFe, NiFeB, TaNiFe and TaNiFeB. The metal material may be at least one material selected from the group consisting of Pt, Pd, Ta, Ti, Al, W, Cu, TiN, WN, TaN, Zr, Zn, Hf, Ag and Au.

The tunnel insulating layer 2 may be an MgO layer or $Al_2O_3$ layer.

The second magnetic layer 3 is a thin film of which magnetization direction is upward or downward in a vertical direction. Here, the magnetization direction of the second magnetic layer 3, which is upward or downward, may have some offset from the vertical direction. The second magnetic layer 3 is formed of an alloy in which a magnetic material and a metal material are mixed together. The magnetic material is at least one selected from the group consisting of Co-, Fe- and Ni-based materials. More specifically, the magnetic material may be at least one material selected from the group consisting of Co, CoB, TaCo, CoFe, CoFeB, TaCoFe, TaCoFeB, Fe, FeB, TaFe, NiFe, NiFeB, TaNiFe and TaNiFeB. Alternatively, the magnetic material may be a material obtained by adding nitrogen to the at least one material selected from the group consisting of Co, CoB, TaCo, CoFe, CoFeB, TaCoFe, TaCoFeB, Fe, FeB, TaFe, NiFe, NiFeB, TaNiFe and TaNiFeB. The metal material may be at least one material selected from the group consisting of Pt, Pd, Ta, Ti, Al, W, Cu, TiN, WN, TaN, Zr, Zn, Hf, Ag and Au.

If the magnetic tunnel junction is fabricated to have the aforementioned structure, the magnetization direction of the second magnetic layer 3 is formed to be upward or downward. Thus, physical limits in the plane area of the magnetic tunnel junction often accompanying use of a horizontal magnetic tunnel junction may be avoided. Here, when the magnetization directions of the magnetic layers are parallel to each other, the horizontal magnetic tunnel junction ensures a minimum/reduced horizontal surface. By using the magnetic tunnel junction in accordance with the exemplary embodiment of the present invention, in which the magnetization directions of the magnetic layers are formed upward and downward, adequate magnetoresistance characteristics can be obtained with the minimum/reduced horizontal surface.

When the magnetization direction of the second magnetic layer 3 is fixed to be upward with respect to the first magnetic layer 1 having a magnetization direction fixed to be upward as illustrated in (a) of FIG. 1, the resistance of the magnetic tunnel junction is increased. On the contrary, when the magnetization direction of the second magnetic layer 3 is fixed to be downward with respect to the first magnetic layer 1 having a magnetization direction fixed to be upward as illustrated in (b) of FIG. 1, the resistance of the magnetic tunnel junction is decreased. A spin transfer random access memory detects a difference in resistance and reads data.

As described above, the first and second magnetic layers 1 and 3 are formed of an alloy obtained by mixing a magnetic material and a metal material together. In this case, the vertical magnetization characteristics of the first and second magnetic layers 1 and 3 depend on the crystal structure of the alloy.

Figure 2A:
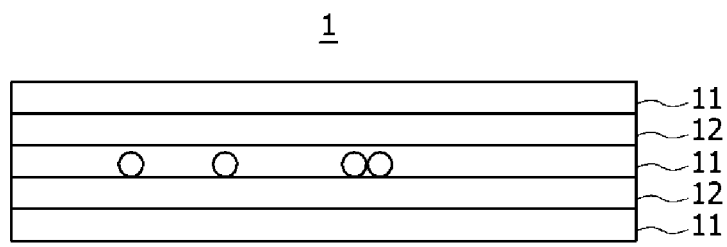
FIGS. 2A and 2B illustrate a magnetic layer formed using a laminate sputtering method.
Figure 2B:
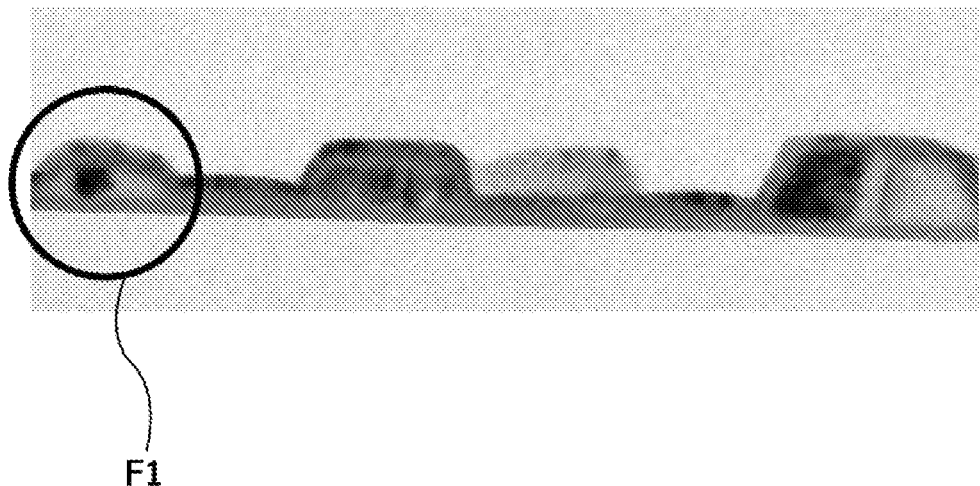

FIGS. 2A and 2B illustrate the first magnetic layer 1 formed using a laminate sputtering method.

As illustrated in FIG. 2A, the first magnetic layer 1 formed using the laminate sputtering method is formed by alternately laminating magnetic layers 11 made of a magnetic material and metal layers 12 made of a metal material. In the laminate sputtering method, the magnetic layer 11 is formed by sputtering, for example, only the magnetic material, and the metal layer 12 is subsequently formed by sputtering, for example, only the metal material. Thus, as described above, the first magnetic layer 1 has a structure in which the magnetic layers 11 and the metal layers 12 are alternately laminated.

However, in the laminate sputtering method, according to an example, only one material is selected and the sputtering is performed on the selected material. Thus, if a thin film formed by sputtering the selected material is observed, an aggregation phenomenon occurs so that the materials become mixed together. Particularly, as illustrated in FIG. 2b, the aggregation phenomenon F1 described above frequently occurs in the magnetic material.

Figure 3:
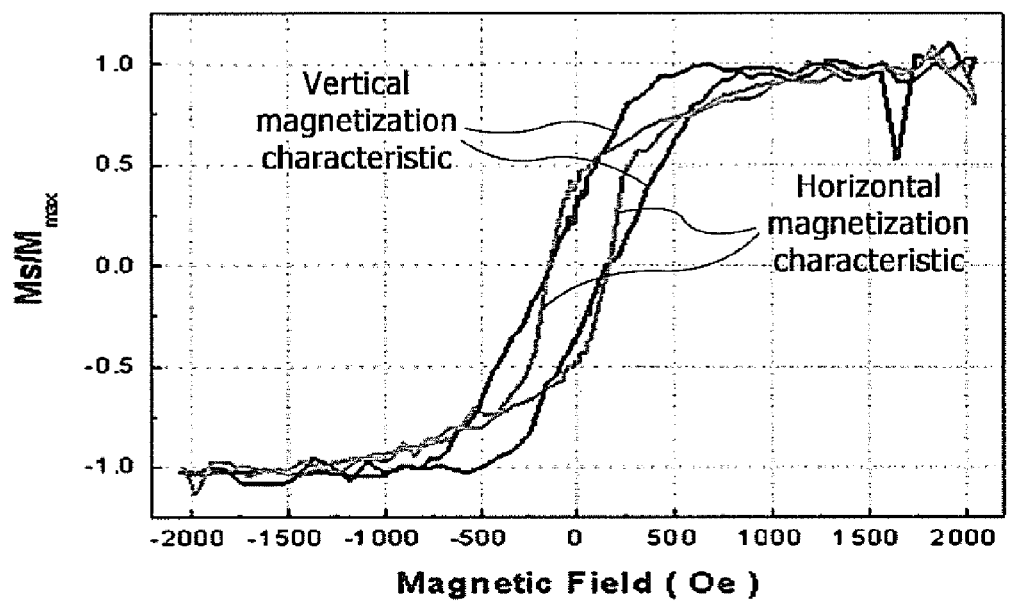
FIG. 3 is a graph illustrating magnetization characteristics of the magnetic layer formed using the laminate sputtering method.

FIG. 3 is a graph illustrating magnetization characteristics of the first magnetic layer 1 formed using the laminate sputtering method.

Referring to FIG. 3, the magnetization characteristics of the first magnetic layer 1 formed using the laminate sputtering method include not only a vertical magnetization characteristic but also a horizontal magnetization characteristic.

Figure 4:
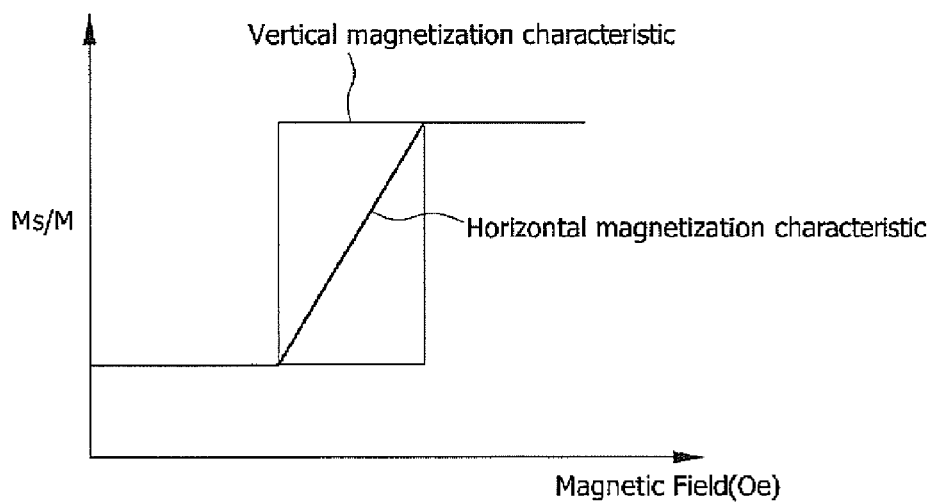
FIG. 4 is a graph illustrating a characteristic of the magnetic layer including only an ideal vertical magnetization characteristic.

For illustration purposes, FIG. 4 shows a graph illustrating a characteristic of the magnetic layer including, for example, only an ideal vertical magnetization characteristic.

Referring to FIG. 4, it can be seen that a line representing the horizontal magnetization characteristic is linear. The characteristic of a magnetic layer having no horizontal magnetization characteristic is that the line representing the horizontal magnetization characteristic is linear along one line. On the other hand, it can be seen that the horizontal magnetization characteristic of the first magnetic layer 1 in FIG. 3 form two lines having a wide separation in-between. This means that the characteristics of the first magnetic layer 1 include the horizontal magnetization characteristic, and accordingly, the first magnetic layer 1 is a thin film in which the vertical and horizontal magnetization characteristics are mixed together. Therefore, the first magnetic layer 1 formed using the laminate sputtering method may not ensure normal upward or downward magnetization characteristics.

Figure 5:
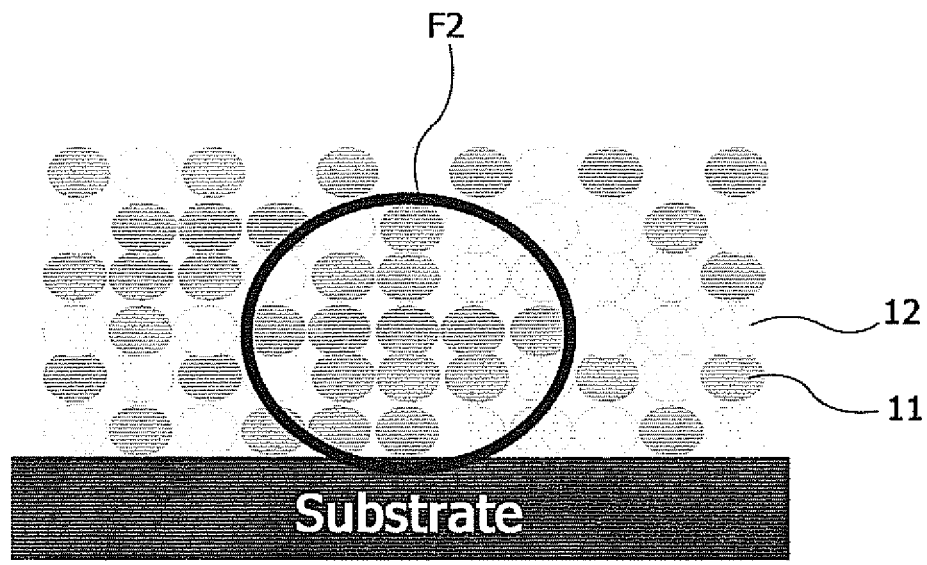
FIG. 5 illustrates the magnetic layer formed using a co-sputtering method.

FIG. 5 illustrates the first magnetic layer 1 formed using a co-sputtering method.

As illustrated in FIG. 5, the first magnetic layer 1 formed using the co-sputtering method is formed in a structure in which the magnetic materials 11 and the metal materials 12 are mixed together. In the co-sputtering method, the first magnetic layer 1 is formed by simultaneously sputtering the magnetic materials 11 and the metal materials 12. Thus, as described above, the first magnetic layer 1 has a structure in which the magnetic materials 11 and the metal materials 12 are mixed together.

However, the magnetic materials 11 and the metal materials 12 are simultaneously sputtered in the co-sputtering method. Thus, if a thin film formed by simultaneously sputtering the magnetic materials 11 and the metal materials 12 is observed, an aggregation phenomenon F2 in which the magnetic materials 11 become mixed together occurs, as observed in the laminate sputtering method.

Figure 6:
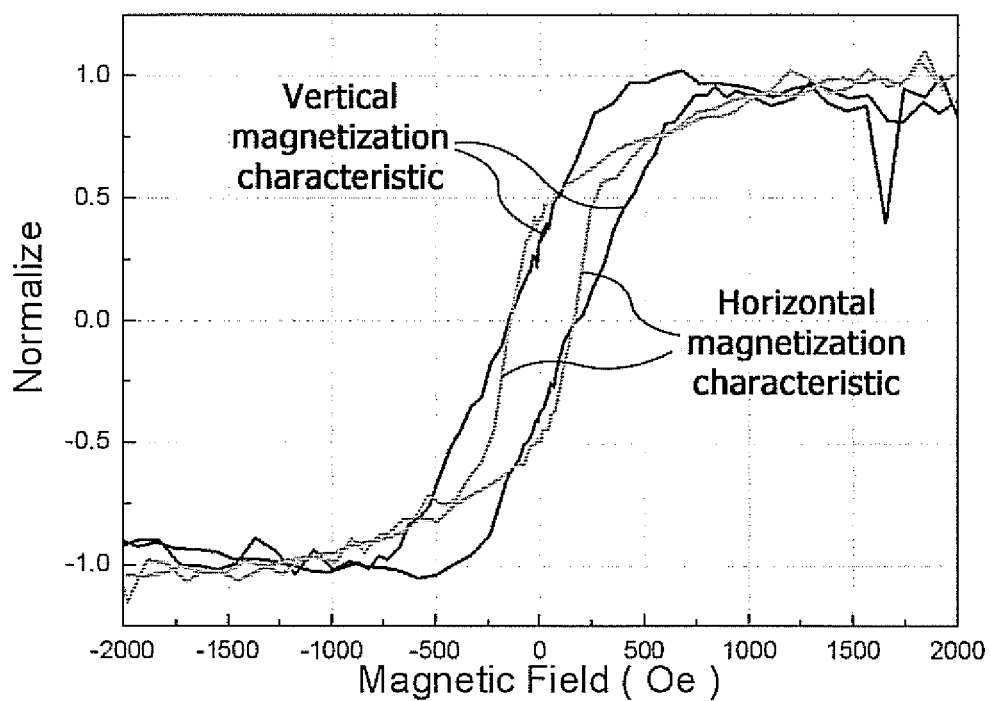
FIG. 6 is a graph illustrating magnetization characteristics of the magnetic layer formed using the co-sputtering method.

FIG. 6 is a graph illustrating magnetization characteristics of the first magnetic layer 1 formed using the co-sputtering method.

Referring to FIG. 6, it can be seen that the magnetization characteristics of the first magnetic layer 1 formed using the co-sputtering method include not only a vertical magnetization characteristic but also a horizontal magnetization characteristic.

In comparing FIG. 6 with FIG. 4, it can be seen that the line representing the horizontal magnetization characteristic of the first magnetic layer 1 formed using the co-sputtering method is divided into two lines having a broad separation in-between. This means that the characteristics of the first magnetic layer 1 include the horizontal magnetization characteristic, and accordingly, the first magnetic layer 1 is a thin film in which the vertical and horizontal magnetization characteristics are mixed together. Therefore, the first magnetic layer 1 formed using the co-sputtering method does not ensure normal upward or downward magnetization characteristics.

Figure 7:
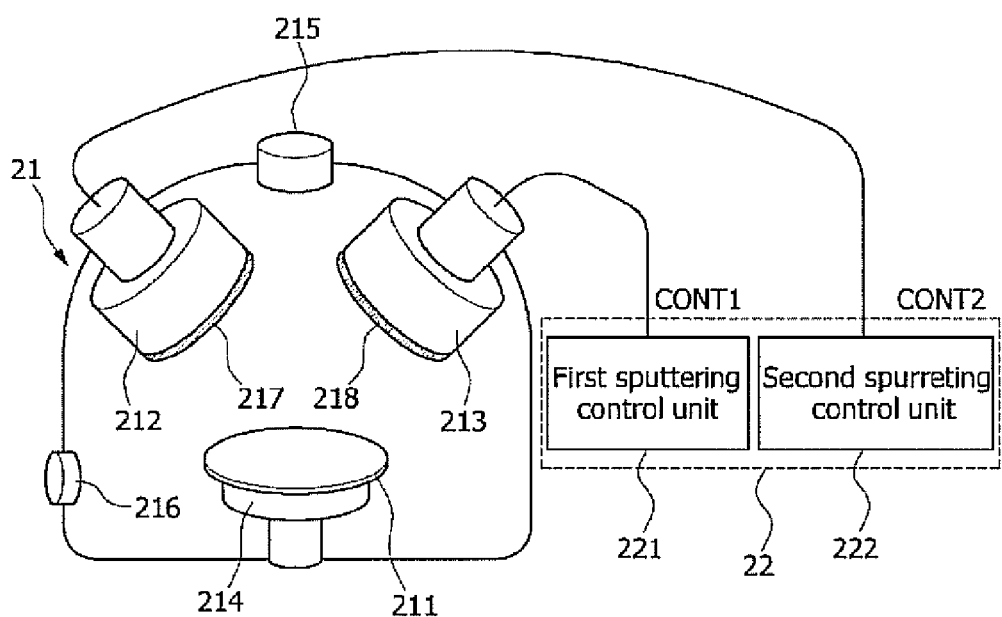
FIG. 7 is a configuration view illustrating a semiconductor fabricating device for fabricating first and second magnetic layers of the magnetic tunnel junction illustrated in FIG. 1 in accordance with the exemplary embodiment of the present invention.

FIG. 7 is a configuration view illustrating a semiconductor fabricating device for fabricating the first and second magnetic layers 1 and 3 of the magnetic tunnel junction illustrated in FIG. 1 in accordance with the exemplary embodiment of the present invention.

As illustrated in FIG. 7, the semiconductor fabricating device includes a chamber 21 and a control circuit 22.

The chamber 21 is a reaction space for sputtering a thin film on a wafer 211, and components for sputtering are disposed in the chamber 21. More specifically, the chamber 21 includes a first sputtering unit 212 for sputtering magnetic materials 217, a second sputtering unit 213 for sputtering metal materials 218, a holding platform having the wafer 211 mounted thereon, an inlet 215 through a sputtering gas is introduced, and an outlet 216 through which a reactive residual gas is exhausted. In addition to the first and second sputtering units 212 and 213, a greater number of sputtering units may be included in the chamber 21.

The control circuit 22 includes a first sputtering control unit 221 that generates a first sputtering control signal CONT1 for controlling the sputtering period of the first sputtering unit 212, and a second sputtering control unit 222 that generates a second sputtering control signal CONT2 for controlling the sputtering period of the second sputtering unit 222. In a case where other sputtering units are provided, the number of control signals outputted from the control circuit 22 increases.

Figure 8:
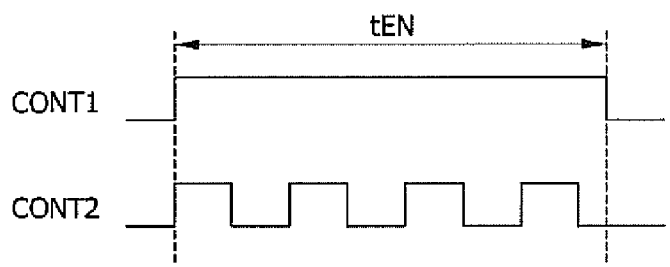
FIG. 8 is a timing diagram illustrating first and second sputtering control signals of FIG. 7.

FIG. 8 is a timing diagram illustrating the first and second sputtering control signals CONT1 and CONT2 of FIG. 7.

As illustrated in FIG. 8, the first sputtering control signal CONT1 is activated during a first period tEN, and the second sputtering control signal CONT2 is activated a plurality of times during the first period tEN.

Thus, the metal materials 218 and the magnetic materials 217 are simultaneously sputtered a plurality of times on the wafer 211 during the first period tEN in the chamber 21.

More specifically, the method for fabricating the first magnetic layer 1 uses the semiconductor fabricating device of FIG. 7. First, the wafer 211 is mounted on the holding platform 214 in the chamber 21. The holding platform 214 can be rotated clockwise or counterclockwise.

Subsequently, a target of the magnetic materials 217 is attached to the first sputtering unit 212, and a target of the metal materials 218 is attached to the second sputtering unit 213. Subsequently, the pressure in the chamber 21 is set to $1E^{-6}$ to $7.6E^{+2}$ torr, and a substrate bias of 1 W to 100 kW is subsequently applied to the chamber 21. A sputtering reaction gas is introduced into the chamber 21. The sputtering reaction gas may be Ar and flows at a flow rate of 1 to 10000 sccm in the chamber 21. Alternatively, the sputtering reaction gas may be at least one selected from the group consisting of $O_2$, $N_2$, He, $H_2$, $NH_3$ and $O_3$. Simultaneous with the introduction of the sputtering gas, the second and first sputtering signals CONT2 and CONT1 are applied to the first and second sputtering units 212 and 213, respectively. Thus, the metal materials 218 are under constant plasma during the first period tEN and sputtered on the wafer 211, and the magnetic materials 217 are under periodic plasma during the first period tEN and thus periodically sputtered on the wafer 211. The first and second sputtering control signals CONT1 and CONT2 may be a DC power of 1 W to 100 kW. Alternatively, the first and second sputtering control signals CONT1 and CONT2 may be RF power.

Figure 9:
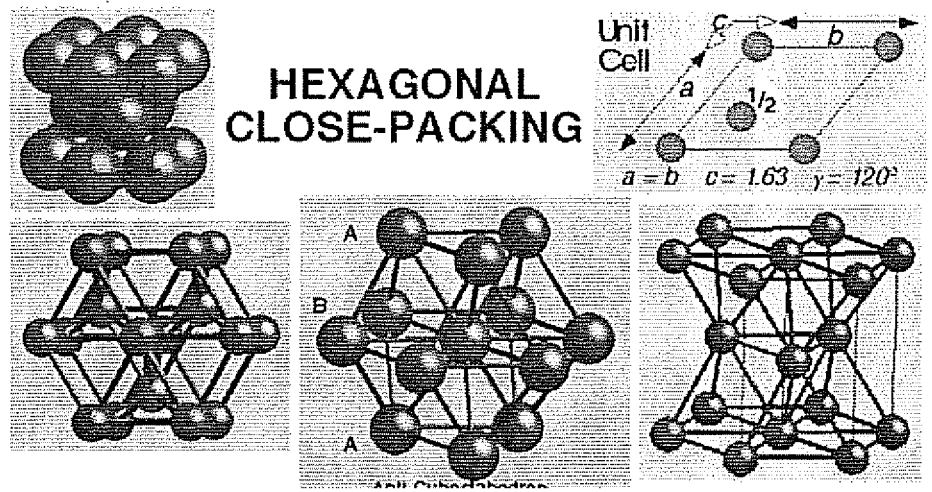
FIG. 9 illustrates crystal structures of the magnetic layer formed by the control signals illustrated in FIG. 8.

In the forming of the first magnetic layer 1 as described above, if the magnetic materials 217 are periodically sputtered while the metal materials 218 are constantly sputtered during the first period tEN, the first magnetic layer 1 is formed as a super-lattice with a hexagonal close-packed (HCP) or L10 (face centered cubic (FCC) or face centered tetragonal (FCT)) crystal structure, which has excellent vertical magnetization characteristics, as illustrated in FIG. 9.

Figure 10:
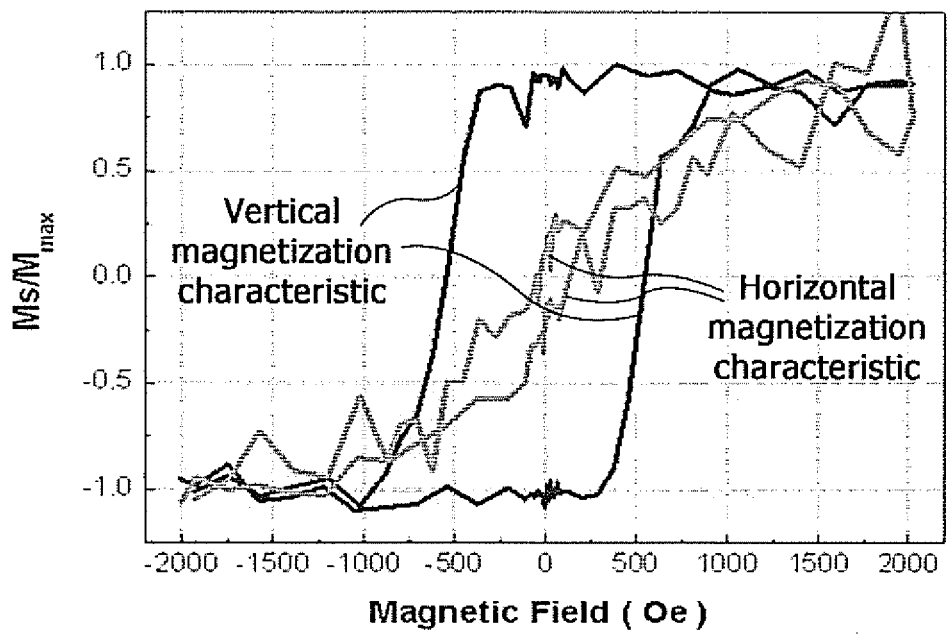
FIG. 10 is a graph illustrating magnetization characteristics of the magnetic layer formed in accordance with the exemplary embodiment of the present invention.

FIG. 10 is a graph illustrating magnetization characteristics of the first magnetic layer 1 formed in accordance with the exemplary embodiment of the present invention.

Referring to FIG. 10, it can be seen that the magnetization characteristic of the first magnetic layer 1 in accordance with the exemplary embodiment of the present invention includes, for example, only the vertical magnetization characteristic. If distortion caused by noise is considered, it can be seen that the magnetization characteristic of the first magnetic layer 1 in accordance with the exemplary embodiment of the present invention is similar to that of the magnetic layer having, for example, only the ideal vertical magnetization characteristic, as compared with FIG. 4. This is because the first magnetic layer 1 is formed as the super-lattice with HCP or L10 (FCC or FCT) crystal structure, which has excellent vertical magnetization characteristics.

Figure 11:
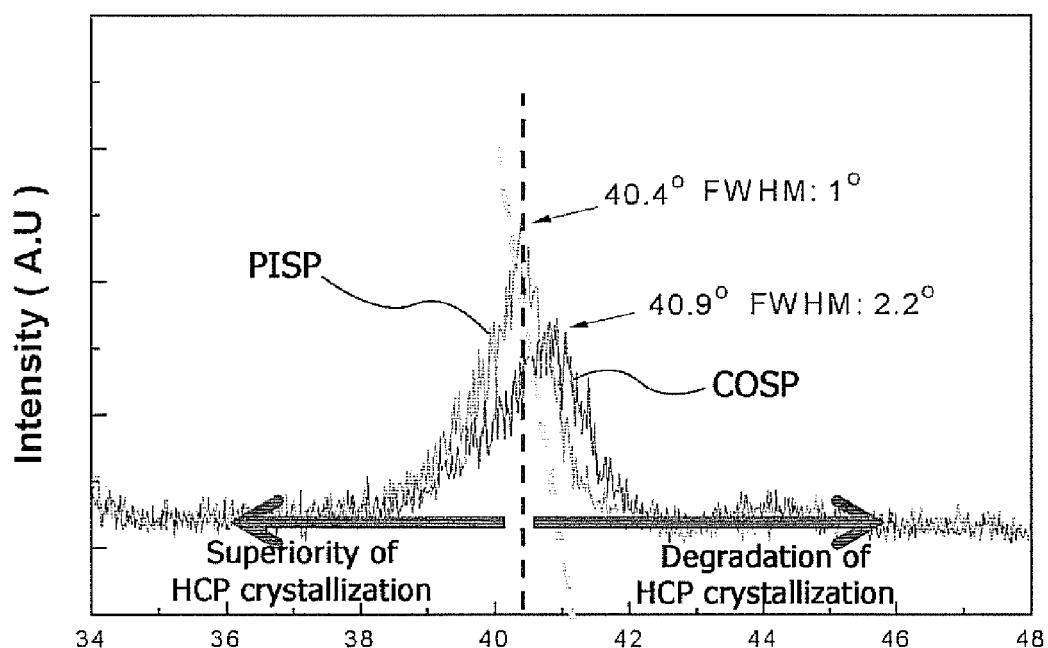
FIG. 11 is a graph illustrating a difference in crystal structure between the magnetic layers respectively formed using the co-sputtering method and the sputtering method in accordance with the exemplary embodiment of the present invention.

FIG. 11 is a graph illustrating a difference in crystal structure between the magnetic layers respectively formed using the co-sputtering method and the sputtering method in accordance with the exemplary embodiment of the present invention.

Referring to FIG. 11, it can be seen that the crystal structure of the magnetic layer (PISP) formed using the sputtering method in accordance with the exemplary embodiment of the present invention has HCP crystallization superior to the magnetic layer (COSP) formed using the co-sputtering method. Thus, the magnetization characteristic of the magnetic layer (PISP) formed using the sputtering method in accordance with the exemplary embodiment of the present invention is superior in a vertical direction to the magnetic layer (COSP) formed using the co-sputtering method.

As described above, in the magnetic tunnel junction in accordance with the exemplary embodiment of the present invention, the magnetic layer is formed by periodically sputtering the magnetic materials while constantly sputtering the metal materials. Accordingly, the magnetic layer is formed as the super-lattice with HCP or L10 (FCC or FCT) crystal structure, which has excellent vertical magnetization characteristics.

Here, when the magnetic tunnel junction is fabricated using a magnetic layer with excellent vertical magnetization characteristics, the plane area of the spin transfer random access memory may be decreased. Thus, the integration degree of the spin transfer random access memory may be increased and thus, the number of net-dies per wafer may be increased.

While the present invention has been described with respect to the specific embodiments, it will be apparent to those skilled in the art that various changes and modifications may be made without departing from the spirit and scope of the invention as defined in the following claims. For example, although only the method for forming the first magnetic layer 1 of FIG. 1 has been described in the aforementioned embodiment, the method for forming the second magnetic layer 3 of FIG. 1 may be identically performed.

Figure 12:
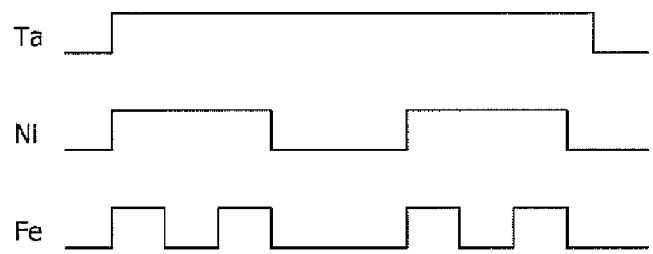
FIG. 12 is a timing diagram illustrating a method for fabricating a magnetic layer with a structure in which three materials are mixed.

In addition to the method for periodically sputtering the magnetic materials while continuously sputtering the metal materials as illustrated in FIG. 8, the first magnetic layer 1 may be formed by periodically sputtering Ni that is a first magnetic material and periodically sputtering Fe that is a second magnetic material within the period in which the Ni is sputtered, while continuously sputtering Ta that is a metal material, as illustrated in FIG. 12. The sputtering scheme according to an exemplary embodiment of the present invention may be changed depending on how many sputtering units and sputtering control units will be used in the semiconductor fabricating device of FIG. 7. According to an exemplary method for forming an alloy of metal materials, the alloy may be formed by periodically sputtering a second metal material while continuously sputtering a first metal material. An alloy of magnetic materials may be formed in the same manner.

What is claimed is:

1. A semiconductor fabricating device, comprising:
   a holding platform having a wafer mounted thereon;
   a first control unit configured to generate a first control signal that is constantly activated during a first period;
   a first sputtering unit configured to continuously sputter a metal target on the wafer in response to the first control signal;
   a second control unit configured to generate a second control signal that is periodically activated during the first period; and
   a second sputtering unit configured to periodically sputter a magnetic target on the wafer in response to the second control signal.

2. The semiconductor fabricating device of claim 1, wherein the first and second control signals have a power of 1 W to 100 kw.

3. The semiconductor fabricating device of claim 1, wherein the magnetic target is at least one selected from the group consisting of Co-based material, Fe-based material, and Ni-based material.

4. The semiconductor fabricating device of claim 1, wherein the magnetic target is at least one selected from the group consisting of Co, CoB, TaCo, CoFe, CoFeB, TaCoFe, TaCoFeB, Fe, FeB, TaFe, NiFe, NiFeB, TaNiFe and TaNiFeB.

5. The semiconductor fabricating device of claim 1, wherein the metal target is at least one selected from the group consisting of Pt, Pd, Ta, Ti, Al, W, Cu, TiN, WN, TaN, Zr, Zn, Hf, Ag and Au.

6. A method for driving a semiconductor fabricating device, comprising:
   mounting a wafer on a holding platform disposed in a chamber; and
   applying a first control signal that is constantly activated during a first period to a first sputtering unit having a metal target attached thereto and simultaneously applying a second control signal that is periodically activated during the first period to a second sputtering unit having a magnetic target attached thereto.

7. The method of claim 6, wherein the first and second control signals have a power of 1 W to 100 kW.

8. The method of claim 6, wherein the magnetic target is at least one selected from the group consisting of Co-based material, Fe-based material, and Ni-based material.

9. The method of claim 6, wherein the magnetic target is at least one selected from the group consisting of Co, CoB, TaCo, CoFe, CoFeB, TaCoFe, TaCoFeB, Fe, FeB, TaFe, NiFe, NiFeB, TaNiFe and TaNiFeB.

10. The method of claim 6, wherein the metal target is at least one selected from the group consisting of Pt, Pd, Ta, Ti, Al, W, Cu, TiN, WN, TaN, Zr, Zn, Hf, Ag and Au.

* * * * *